(12) United States Patent
Kim et al.

(10) Patent No.: US 11,818,928 B2
(45) Date of Patent: Nov. 14, 2023

(54) DISPLAY APPARATUS INCLUDING A DISPLAY PANEL HAVING A FIRST PAD PORTION AND A FLEXIBLE PRINTED CIRCUIT BOARD HAVING A SECOND PAD PORTION

(71) Applicant: SAMSUNG DISPLAY CO., LTD., Yongin-si (KR)

(72) Inventors: Huntae Kim, Yongin-si (KR); Sungun Park, Yongin-si (KR); Dongyoub Lee, Yongin-si (KR); Jiwon Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 189 days.

(21) Appl. No.: 17/369,188

(22) Filed: Jul. 7, 2021

(65) Prior Publication Data

US 2022/0013620 A1    Jan. 13, 2022

(30) Foreign Application Priority Data

Jul. 8, 2020 (KR) ........................ 10-2020-0084341

(51) Int. Cl.
*H01L 29/08* (2006.01)
*H10K 59/131* (2023.01)
*H05K 1/18* (2006.01)
*H10K 59/121* (2023.01)

(52) U.S. Cl.
CPC ........... *H10K 59/131* (2023.02); *H05K 1/189* (2013.01); *H10K 59/1213* (2023.02); *H10K 59/1216* (2023.02); *H05K 2201/10128* (2013.01)

(58) Field of Classification Search
CPC ............ H10K 59/131; H10K 59/1213; H10K 59/1216; H05K 2201/10128
USPC ............................................................ 257/40
See application file for complete search history.

(56) References Cited

U.S. PATENT DOCUMENTS

| 7,786,478 | B2 | 8/2010 | Kudo |
| 8,803,866 | B2 | 8/2014 | Lee |
| 9,831,432 | B2 | 11/2017 | Im |
| 10,706,787 | B2 | 7/2020 | Hyun et al. |

(Continued)

FOREIGN PATENT DOCUMENTS

| KR | 10-2017-0039813 | 4/2017 |
| KR | 10-1844431 | 4/2018 |

(Continued)

*Primary Examiner* — Phuc T Dang
(74) *Attorney, Agent, or Firm* — F. Chau & Associates, LLC

(57) ABSTRACT

A display apparatus having a display panel that includes a first pad portion is provided. A flexible printed circuit board is configured to attach to the display panel. The flexible printed circuit board includes a second pad portion that is configured to electrically connect to the first pad portion. The first pad portion includes a plurality of first signal pads, a first test pad, and a first alignment pad having a first shape. The second pad portion comprises a second alignment pad having a second shape. The second alignment pad includes a first portion and a second portion that are spaced apart from each other. The first shape and the second shape are configured to form a predetermined alignment mark when the flexible printed circuit board is attached to the display panel at a predetermined position.

19 Claims, 10 Drawing Sheets

(56) References Cited

U.S. PATENT DOCUMENTS

| | | | |
|---|---|---|---|
| 2014/0354143 A1* | 12/2014 | Jung | G06F 3/041 |
| | | | 313/511 |
| 2016/0242295 A1* | 8/2016 | Kim | H05K 1/189 |
| 2018/0063954 A1* | 3/2018 | Kim | H05K 1/0268 |
| 2018/0110122 A1* | 4/2018 | Lee | H10K 59/131 |
| 2019/0348357 A1 | 11/2019 | Lee et al. | |

FOREIGN PATENT DOCUMENTS

| KR | 10-2019-0129153 | 11/2019 |
|---|---|---|
| KR | 10-2020-0008078 | 1/2020 |

\* cited by examiner

DISPLAY APPARATUS INCLUDING A DISPLAY PANEL HAVING A FIRST PAD PORTION AND A FLEXIBLE PRINTED CIRCUIT BOARD HAVING A SECOND PAD PORTION

CROSS-REFERENCE TO RELATED APPLICATION

This application claims priority under 35 U.S.C. § 119 to Korean Patent Application No. 10-2020-0084341, filed on Jul. 8, 2020, in the Korean Intellectual Property Office, the disclosure of which is incorporated by reference in its entirety herein.

1. TECHNICAL FIELD

One or more exemplary embodiments relate to display apparatuses.

2. DISCUSSION OF RELATED ART

A display apparatus is an electronic device that displays images. The display apparatus includes a display panel that generates an image and a driving integrated circuit that drives the display panel. The display panel may include a display area and a peripheral area that is positioned outside the display area. A scan line and a data line are formed and are insulated from each other in the display area. A plurality of pixel circuits is connected to the scan line and the data line. Light is emitted from pixels corresponding to each of the pixel circuits, and the image is generated by this light.

The peripheral area is an area from which light is not emitted and an image is not displayed. A driving integrated circuit or the like may be disposed in the peripheral area. Further, a circuit board connected to an application processor or the like may be disposed in the peripheral area. A pad portion may be disposed in the peripheral area of the display panel and may connect the circuit board to the display panel. The pad portion may be exposed to the outside for attaching the circuit board. When the circuit board is attached to the pad portion, the attachment must be made at the correct position, and an adhesion defect test may be performed to confirm that the circuit board is properly connected to the pad portion.

SUMMARY

One or more exemplary embodiments include a display apparatus in which a circuit board is properly connected to a display panel at a predetermined position, in addition, because the pad portion area in which the circuit board and the display panel are mutually attached to each other may be a dead space of the display apparatus, one or more exemplary embodiments provide a display apparatus in which an area of a pad portion area may be reduced. However, these aspects are exemplary, and the scope of the present inventive concepts is not limited thereby.

Additional aspects will be set forth in part in the description which follows and, in part, will be apparent from the description, or may be learned by practice of the presented exemplary embodiments of the present inventive concepts.

One or more exemplary embodiments include a display apparatus having a display panel that includes a first pad portion. A flexible printed circuit board is configured to attach to the display panel. The flexible printed circuit board includes a second pad portion that is configured to electrically connect to the first pad portion. The first pad portion includes a plurality of first signal pads, a first test pad, and a first alignment pad having a first shape. The second pad portion comprises a second alignment pad having a second shape. The second alignment pad includes a first portion and a second portion that are spaced apart from each other. The first shape and the second shape are configured to form a predetermined alignment mark when the flexible printed circuit board is attached to the display panel at a predetermined position.

Each of the first portion and the second portion of the second alignment pad may overlap a portion of the first alignment pad.

The second pad portion may further include a plurality of second signal pads respectively corresponding to the plurality of first signal pads, and a second test pad arranged to be spaced apart from the second alignment pad, and corresponding to the first test pad.

The second test pad may be arranged between the second alignment pad and the plurality of second signal pads, on a plane.

The second test pad and the first portion and the second portion of the second alignment pad may have a shape isolated from each other.

The second test pad, and the first portion and the second portion of the second alignment pad may be spaced apart from each other, and a portion of the first alignment pad may be positioned between the second test pad and the first portion of the second alignment pad, and between the first and second portions of the second alignment pad, on a plane. Each of the second test pad and the second alignment pad may include a test terminal.

The second test pad may include two or more test terminals, and each of the first portion and the second portion of the second alignment pad may include a test terminal.

When a current is applied to one of the test terminal of the second test pad and the test terminal of the second alignment pad and the other one is grounded, the first alignment pad and the second alignment pad may form a path through which the current flows.

The first alignment pad may be electrically connected to the first test pad.

The first alignment pad may include a body portion extending in a first direction from the first test pad, and a branch portion protruding from the body portion in a second direction intersecting with the first direction.

The first portion of the second alignment pad may include a protruding portion placed on an opposite side of the branch portion relative to the body portion of the first alignment pad, on a plane.

The plurality of first signal pads and the plurality of second signal pads may be arranged in a first direction, the first portion of the second alignment pad may include a portion extending in the first direction, and the second portion of the second alignment pad may be spaced apart from the first portion in a second direction intersecting with the first direction.

The plurality of first signal pads and the plurality of second signal pads may be arranged in a first direction, the first portion of the second alignment pad may include a portion extending in a second direction intersecting with the first direction, and the second portion of the second alignment pad may be spaced apart from the first portion in the first direction.

The plurality of first signal pads and the plurality of second signal pads may be arranged in a first direction, one of the plurality of first signal pads and one of the plurality of second signal pads may extend in a second direction intersecting with the first direction, and the other one of the plurality of first signal pads and the other one of the plurality of second signal pads may extend in a third direction different from the first direction and the second direction.

A length of the plurality of first signal pads may be greater than a length of the plurality of second signal pads.

The display apparatus may further include a conductive adhesive member between the first pad portion and the second pad portion.

The display apparatus may further include a plurality of pixel circuits each including thin-film transistors and a storage capacitor, wherein the plurality of first signal pads are electrically connected to the plurality of pixel circuits, respectively, and the first test pad is electrically open with the plurality of pixel circuits.

Other aspects, features, and advantages other than those described above will become apparent from the detailed content, claims and drawings for carrying out the following exemplary embodiments.

These general and specific exemplary embodiments may be implemented by using a system, method, computer program, or any combination thereof.

BRIEF DESCRIPTION OF THE DRAWINGS

The above and other aspects, features, and advantages of exemplary embodiments of the present inventive concepts will be more apparent from the following description taken in conjunction with the accompanying drawings, in which.

DETAILED DESCRIPTION OF EXEMPLARY EMBODIMENTS

Figure 1:
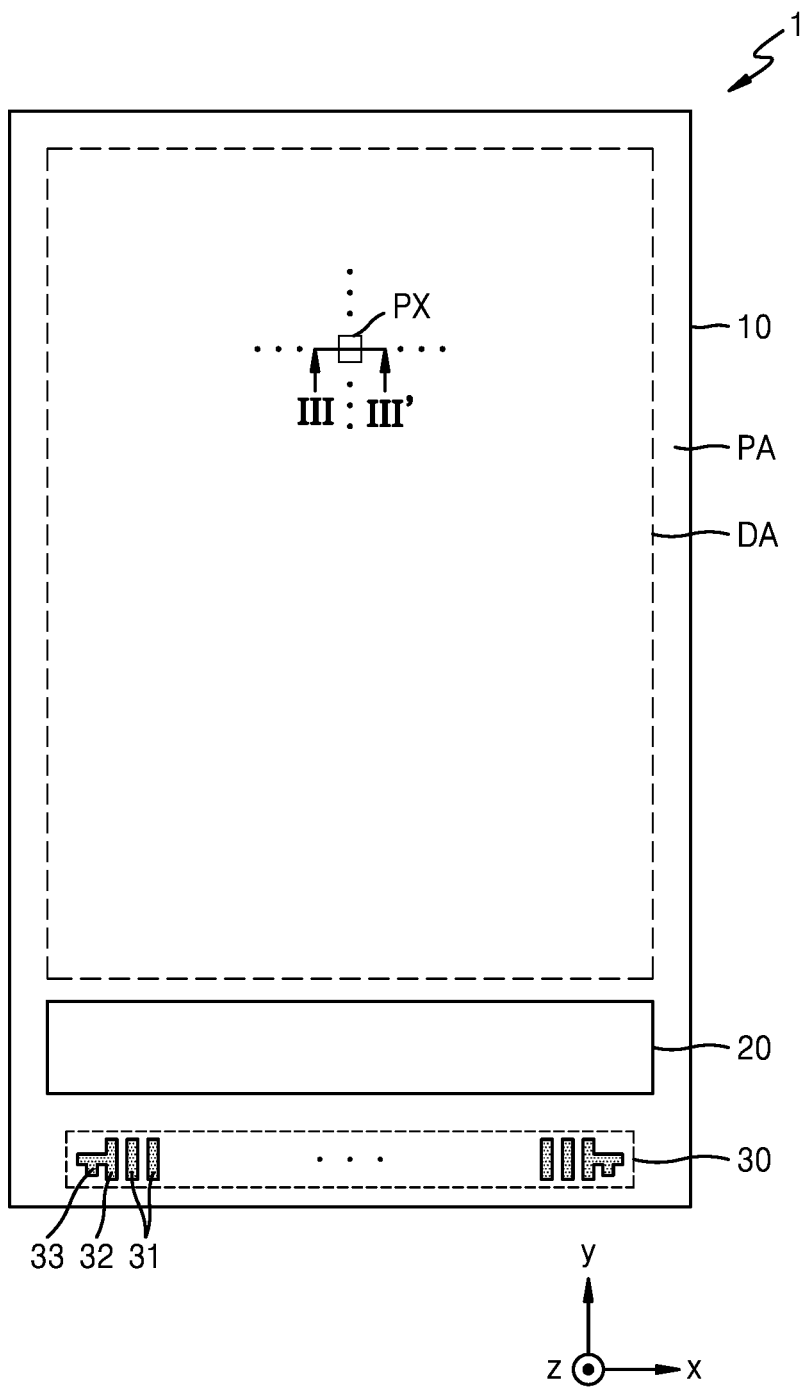
FIG. 1 is a plan view illustrating a display apparatus, according to an exemplary embodiment of the present inventive concepts.

Reference will now be made in detail to embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular exemplary embodiments will be illustrated in the drawings and described in detail in the written description. Hereinafter, effects and features of the present inventive concepts and a method for accomplishing them will be described more fully with reference to the accompanying drawings, in which exemplary embodiments of the present inventive concepts are shown. This disclosure may, however, be embodied in many different forms and should not be construed as limited to the exemplary embodiments set forth herein.

One or more exemplary embodiments of the present inventive concepts will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" or "disposed on" another layer, area, or element, it can be directly or indirectly formed on, or disposed on, the other layer, region, or element. For example, intervening layers, regions, or elements may be present. However, when a layer, region, or element is referred to as being "formed directly on" or "disposed directly on" another layer, area, or element, no intervening layers, regions, or elements may be present.

Sizes of elements in the drawings may be exaggerated for convenience of explanation. In other words, because sizes and thicknesses of components in the drawings are arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

In the disclosure, "A and/or B" may include "A," "B," or "A and B." In addition, in the present disclosure, "at least one of A and B" may include "A," "B," or "A and B."

In the exemplary embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected,"

they may be directly electrically connected, or layers, areas or elements may be indirectly electrically connected thereto and an intervening portion may be present.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions which may cross each other at various different angles and are not perpendicular to one another.

FIG. 1 is a plan view schematically illustrating a display apparatus 1, according to an exemplary embodiment of the present inventive concepts.

Referring to the exemplary embodiment of FIG. 1, the display apparatus 1 may include a display panel 10 that includes a driver integrated circuit 20 and a first pad portion 30.

The display panel 10 may include a display area DA and a peripheral area PA disposed outside of the display area DA. The display panel 10 may provide an image through an array of a plurality of pixels PXs arranged in the display area DA. Each of the pixels PX may include a light-emitting element that emits light of a certain color (e.g., red, green, or blue light), and the display panel 10 may provide an image by using light emitted through the light-emitting element.

As shown in the exemplary embodiment of FIG. 1, the display area DA may have a rectangular shape defined in a plane in a direction along the x axis (hereinafter, the "X direction") and along the y axis (hereinafter, the "Y direction"). A thickness direction of the display apparatus 1 may be extend in a direction along the z axis (hereinafter, the "Z direction") which is perpendicular to the X and Y directions. The display area DA has relatively longer sides extending in the Y direction and relatively shorter sides extending in the X direction. However, exemplary embodiments of the present inventive concepts are not limited thereto. For example, in another exemplary embodiment, the display area DA may have a rectangular shape that has relatively longer sides extending in the X direction and relatively shorter sides extending in the Y direction. However, in other exemplary embodiments, the display area DA may be another polygonal shape such as a square, or an ellipse or a circular shape or an irregular shape, etc.

The peripheral area PA is an area where an image is not generated and may be a non-display area. The peripheral area PA may completely or partially surround the display area DA. For example, as shown in the exemplary embodiment of FIG. 1, the peripheral area PA may surround all four sides of the display area DA. However, in another exemplary embodiment, the display area DA may extend to at least one edge of the display panel 10 and the peripheral area PA may not surround one or more sides of the display area DA. The driver integrated circuit 20 may be disposed in the peripheral area PA. For example, in the exemplary embodiment shown in FIG. 1, the driver integrated circuit 20 may be disposed on a lower portion of the peripheral area PA (e.g., in the Y direction). However, exemplary embodiments of the present inventive concepts are not limited thereto and the driver integrated circuit may be arranged in other portions of the peripheral area PA in other exemplary embodiments. In an exemplary embodiment, the driver integrated circuit 20 may be mounted in a chip-on-glass (COG) method, a chip-on-film (COF) method, or a chip-on-plastic (COP) method. However, exemplary embodiments of the present inventive concepts are not limited thereto. The driver integrated circuit 20 generates electrical signals in response to driving power and signals received from the outside, and provides the generated electronic signals to each of the pixel circuits PCs (in FIG. 2) as described later below.

In addition, the first pad portion 30 may be disposed in the peripheral area PA. For example, as shown in the exemplary embodiment of FIG. 1, the first pad portion 30 may be disposed on a lower portion of the peripheral area PA (e.g., in the Y direction) and may be spaced apart from the driver integrated circuit 20 (e.g., in the Y direction). The first pad portion 30 is an area that a printed circuit board (PCB) or the like may be electrically connected thereto. The first pad portion 30 may include a plurality of first signal pads 31, a first test pad 32, and a first alignment pad 33. As shown in the exemplary embodiment of FIG. 1, the display panel 10 may have two first signal pads 31. However, in other exemplary embodiments, the number of the plurality of first signal pads 31 may vary.

The plurality of first signal pads 31 may be electrically connected to the driver integrated circuit 20 through lines, conductive layers, etc., and electrical signals from the PCB may be transmitted to the driver integrated circuit 20 through the plurality of first signal pads 31. The first test pad 32 may be used to confirm that the display panel 10 and the PCB are properly attached to each other. For example, unlike the plurality of first signal pads 31, the first test pad 32 may be insulated from the first signal pads 31 and may not be electrically connected to the driver integrated circuit 20. For example, between the first test pad 32 and the driver integrated circuit 20 may be electrically open, and as a result, the first test pad 32 may be electrically open with the pixel circuits PCs. The first alignment pad 33 may be used to align the PCB with the display panel 10 such that the PCB may be attached to the display panel 10 at a predetermined position that may provide an increased adhesion level between the PCB and the display panel 10 and to provide sufficient electrical connection therebetween. As shown in the exemplary embodiment of FIG. 1, the first alignment pad 33, the first test pad 32 and the first signal pads 31 may be arranged in the X direction. However, exemplary embodiments of the present inventive concepts are not limited thereto and the first alignment pad 33, the first test pad 32 and the first signal pads 31 may be variously arranged in the peripheral area PA.

Figure 2:
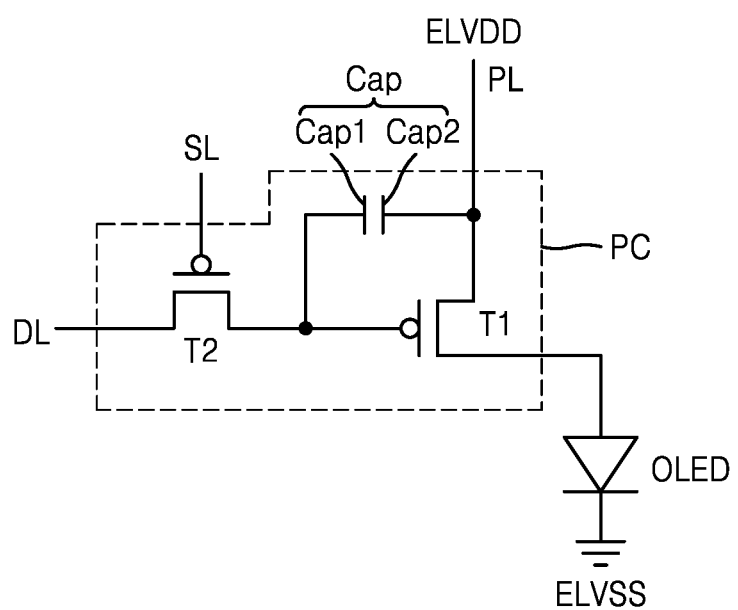
FIG. 2 is an equivalent circuit diagram of a pixel circuit included in a display apparatus, according to an exemplary embodiment of the present inventive concepts.

FIG. 2 is an equivalent circuit diagram of a pixel circuit included in a display apparatus, according to an exemplary embodiment of the present inventive concepts.

Referring to the exemplary embodiment of FIG. 2, the display apparatus 1 (in FIG. 1) may include a light-emitting element and a pixel circuit PC. The light-emitting element may include a light-emitting diode, such as an organic light-emitting diode OLED. However, exemplary embodiments of the present inventive concepts are not limited thereto and the light-emitting element may be various other light-emitting elements. The organic light-emitting diode OLED may be electrically connected to the pixel circuit PC, and may receive a driving voltage through the pixel circuit PC and emit light. The light-emitting element emits light through a light-emitting area, and the light-emitting area may be defined as the pixel PX (in FIG. 1).

The pixel circuit PC may include a plurality of thin-film transistors and a storage capacitor. In an exemplary embodiment, the pixel circuit PC may include a first thin-film transistor T1, a second thin-film transistor T2, and a storage capacitor Cap.

The second thin-film transistor T2 may be a switching thin-film transistor. The second thin-film transistor T2 may be connected to a scan line SL and a data line DL. The second thin-film transistor T2 may transfer a data voltage (e.g., a data signal) input from the data line DL to the first thin-film transistor T1 based on a switching voltage (e.g., a switching signal) input from the scan line SL.

The storage capacitor Cap is connected to the second thin-film transistor T2 and a driving voltage line PL. The storage capacitor Cap may store a voltage corresponding to the difference between a voltage received from the second thin-film transistor T2 and a first power voltage ELVDD that is applied to the driving voltage line PL. The storage capacitor Cap may include at least a first power storage plate Cap1 and a second power storage plate Cap2. However, exemplary embodiments of the present inventive concepts are not limited thereto.

The first thin-film transistor T1 may be a driving thin-film transistor. The first thin-film transistor T1 may be connected to the driving voltage line PL and the storage capacitor Cap. The first thin-film transistor T1 may control a driving current flowing from the driving voltage line PL to the organic light-emitting diode OLED in response to a voltage value stored in the storage capacitor Cap. The organic light-emitting diode OLED may emit light having a certain luminance according to the driving current. An opposite electrode (e.g., the cathode) of the organic light-emitting diode OLED may receive a second power voltage ELVSS.

In the exemplary embodiment of FIG. 2, the pixel circuit PC includes two thin-film transistors and one storage capacitor. However, exemplary embodiments of the present inventive concepts are not limited thereto. For example, in other exemplary embodiments, the pixel circuit PC may include three or more thin-film transistors and/or two or more storage capacitors. For example, in an exemplary embodiment, the pixel circuit PC may include seven thin-film transistors and one storage capacitor. The number of thin-film transistors and storage capacitors may vary according to the design of the pixel circuit PC. However, for convenience of description, an embodiment in which the pixel circuit PC includes two thin-film transistors and one storage capacitor will be described below.

Figure 3:
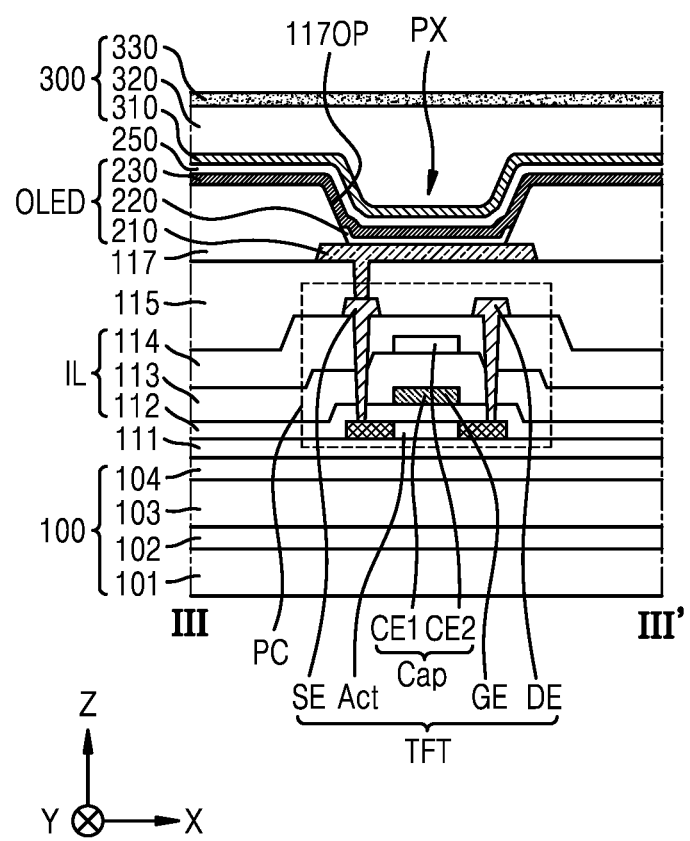
FIG. 3 is a cross-sectional view taken along line III-III' of FIG. 1 illustrating a portion of the display apparatus, according to an exemplary embodiment of the present inventive concepts.

FIG. 3 is a cross-sectional view schematically illustrating a portion of the display apparatus of FIG. 1, according to an exemplary embodiment of the present inventive concepts. FIG. 3 may correspond to a cross-section of the display apparatus, taken along line III-III' in FIG. 1.

Referring to the exemplary embodiment of FIG. 3, a substrate 100 may have a multi-layer structure including a base layer and an inorganic layer. The base layer may include a polymer resin. For example, the substrate 100 may include a base layer and a barrier layer. The base layer may include a polymer resin, and the barrier layer may include an inorganic insulating layer. For example, the substrate 100 may include a first base layer 101, a first barrier layer 102, a second base layer 103, and a second barrier layer 104 that are sequentially stacked (e.g., in the Z direction). In an exemplary embodiment, the first base layer 101 and the second base layer 103 may include at least one compound selected from polyethersulfone, polyacrylate, polyether imide, polyethylene naphthalate, polyethylene terephthalide, polyphenylene sulfide, polyarylate, polyimide, polycarbonate, cellulose acetate propionate, and the like. The first barrier layer 102 and the second barrier layer 104 may include inorganic insulating materials such as at least one compound selected from silicon oxide, silicon oxynitride, and silicon nitride. However, exemplary embodiments of the present inventive concepts are not limited thereto.

A buffer layer 111 may be disposed on the substrate 100. For example, as shown in the exemplary embodiment of FIG. 3, a lower surface of the buffer layer 111 may directly contact an upper surface of the second barrier layer 104. However, exemplary embodiments of the present inventive concepts are not limited thereto. The buffer layer 111 may reduce or block foreign materials, moisture, or ambient air from penetrating through a lower portion of the substrate 100, and may provide a flat surface on the substrate 100. In an exemplary embodiment, the buffer layer 111 may include an inorganic insulating material such as at least one compound selected from silicon oxide, silicon oxynitride, and silicon nitride, and may have a single layer or multi-layer structure including the above-described material.

The pixel circuit PC may be disposed on the buffer layer 111. For example, as shown in the exemplary embodiment of FIG. 3, the pixel circuit PC may be disposed directly on the buffer layer 111. The pixel circuit PC may include a thin-film transistor TFT and a storage capacitor Cap.

The thin-film transistor TFT may include a semiconductor layer Act, a gate electrode GE overlapping a channel area of the semiconductor layer Act (e.g., in the Z direction), and a source electrode SE and a drain electrode DE connected to a source area and a drain area of the semiconductor layer Act, respectively. A first gate insulating layer 112 may be disposed between the semiconductor layer Act and the gate electrode GE (e.g., in the Z direction). A second gate insulating layer 113 and an interlayer insulating layer 114 may be disposed between the gate electrode GE and the source electrode SE and/or between the gate electrode GE and the drain electrode DE (e.g., in the Z direction).

The storage capacitor Cap may be disposed to overlap the thin-film transistor TFT. A shown in the exemplary embodiment of FIG. 3, the storage capacitor Cap may include a first capacitor plate CE1 and a second capacitor plate CE2 overlapping each other (e.g., in the Z direction). In some exemplary embodiments, the gate electrode GE of the thin-film transistor TFT may include the first capacitor plate CE1 of the storage capacitor Cap. The second gate insulating layer 113 may be disposed between the first capacitor plate CE1 and the second capacitor plate CE2.

In an exemplary embodiment, the semiconductor layer Act may include polysilicon. For example, in some exemplary embodiments, the semiconductor layer Act may include amorphous silicon. In some exemplary embodiments, the semiconductor layer Act may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer Act may include a channel area, and a source area and a drain area doped with impurities.

The first gate insulating layer 112 may include an inorganic insulating material such as at least one compound selected from silicon oxide, silicon oxynitride, and silicon nitride, and may have a single-layer or multi-layer structure including the above-described material.

The gate electrode GE or the first capacitor plate CE1 may include a low-resistance conductive material such as at least one compound selected from molybdenum (Mo), aluminum (Al), copper (Cu), and/or titanium (Ti), and may be a single layer or a multi-layer of the above-described material.

The second gate insulating layer 113 may include an inorganic insulating material such as at least one compound selected from silicon oxide, silicon oxynitride, and silicon nitride, and may have a single-layer or multi-layer structure including the above-described material.

The second capacitor plate CE2 may include at least one compound selected from Al, platinum (Pt), palladium (Pd), silver (Ag), magnesium (Mg), gold (Au), nickel (Ni), neodymium (Nd), iridium fir), chromium (Cr), calcium (Ca), Mo, Ti, tungsten (W), and Cu, and may have a single-layer or multi-layer structure including the above-described material.

The interlayer insulating layer 114 may include an inorganic insulating material such as at least one compound selected from silicon oxide, silicon oxynitride, and silicon nitride, and may have a single-layer or multi-layer structure including the aforementioned material.

The source electrode SE or the drain electrode DE may include at least one compound selected from Al, Pt, Pd, Ag, Mg, Au, Ni, Nd, Ir, Cr, Ca, Mo, Ti, W, and Cu, and may include a single-layer or a multi-layer structure including the aforementioned material. For example, the source electrode SE or the drain electrode DE may have a three-layer structure of a Ti layer/Al layer/Ti layer.

The pixel circuit PC including the aforementioned thin-film transistor TFT and the storage capacitor Cap may be electrically connected to a pixel electrode 210.

A planarization layer 115 may be disposed above the first gate insulating layer 112, the second gate insulating layer 113, and the interlayer insulating layer 114. For example, as shown in the exemplary embodiment of FIG. 3, a lower surface of the planarization layer 115 may directly contact an upper surface of the interlayer insulating layer 114 and an upper surface and lateral side surfaces of the source electrode SE and the drain electrode DE. The planarization layer 115 may be disposed above the thin-film transistor TFT of the pixel circuit PC. For example, the planarization layer 115 may be disposed between the thin-film transistor TFT of the pixel circuit PC and the pixel electrode 210 (e.g., in the Z direction). The planarization layer 115 may include an organic insulating material. For example, the planarization layer 115 may include an organic insulating material such as at least one compound selected from acrylic, benzocyclobutene (BCB), polyimide, and hexamethyldisiloxane (HMDSO). The organic insulating material of the planarization layer 115 may be a photosensitive organic insulating material.

The pixel electrode 210 may be disposed on the planarization layer 115. For example, as shown in the exemplary embodiment of FIG. 3, a lower surface of the pixel electrode 210 may directly contact an upper surface of the planarization layer 115. The pixel electrode 210 may be electrically connected to the pixel circuit PC through a contact hole formed in the planarization layer 115. For example, as shown in the exemplary embodiment of FIG. 3, the pixel electrode 210 may directly contact the source electrode SE through the contact hole formed in the planarization layer 115 for electrical connection to the pixel circuit PC.

In an exemplary embodiment, the pixel electrode 210 may include a reflective film including Ag, Mg, Al, Pt, Pd, Au, Ni, Nd, Ir, Cr, or a compound thereof. The pixel electrode 210 may include a reflective layer including the above-described material, and a transparent conductive film above and/or below the reflective layer. The transparent conductive film may include at least one compound selected from indium tin oxide (ITO), indium zinc oxide (IZO), zinc oxide (ZnO), indium oxide, indium gallium oxide (IGO), aluminum zinc oxide (AZO), or the like. In an exemplary embodiment, the pixel electrode 210 may have a three-layer structure of an ITO layer/Ag layer/ITO layer sequentially stacked (e.g., in the Z direction).

A pixel defining layer 117 may be disposed on the pixel electrode 210. The pixel defining layer 117 may cover the lateral edges of the pixel electrode 210 and may include an opening 117OP overlapping the central portion of the pixel electrode 210.

The pixel defining layer 117 may prevent an arc or the like from occurring at a lateral edge of the pixel electrode 210 by increasing a distance between the lateral edge of the pixel electrode 210 and an opposite electrode 230 disposed above the pixel electrode 210. In an exemplary embodiment, the pixel defining layer 117 may include an organic insulating material such as at least one compound selected from polyimide, polyamide, acrylic resin, BCB, HMDSO, and phenol resin. The pixel defining layer 117 may be formed by a method such as spin coating. However, exemplary embodiments of the present inventive concepts are not limited thereto.

An intermediate layer 220 formed to correspond to the pixel electrode 210 is disposed on the pixel defining layer 117. In an exemplary embodiment, the intermediate layer 220 may include a high molecular weight organic material or a low molecular weight organic material emitting light of a certain color.

The opposite electrode 230 may be disposed on the intermediate layer 220. For example, as shown in the exemplary embodiment of FIG. 3, a lower surface of the intermediate layer 220 may directly contact an upper surface of the pixel electrode 210 and an upper surface of the intermediate layer 220 may directly contact a lower surface of the opposite electrode 230. The opposite electrode 230 may be made of a conductive material having a relatively low work function. For example, in an exemplary embodiment, the opposite electrode 230 may include a (semi) transparent layer including Ag, Mg, Al, Ni, Cr, Li, Ca, or an alloy thereof. Alternatively, the opposite electrode 230 may further include a layer including at least one compound selected from ITO, IZO, ZnO, and $In_2O_3$ on the (semitransparent layer including the materials described above. In an exemplary embodiment, the opposite electrode 230 may include Ag and Mg. In an exemplary embodiment, the opposite electrode 230 may be integrally formed to entirely cover the display area DA (in FIG. 1) and may extend to numerous pixels PX.

The stack structure of the pixel electrode 210, the intermediate layer 220, and the opposite electrode 230 may form a light-emitting diode, for example, an organic light-emitting diode OLED. The organic light-emitting diode OLED may emit red, green, or blue light, and a light-emitting area of each organic light-emitting diode OLED corresponds to the pixel PX. Since the opening 117OP of the pixel defining layer 117 defines the size and/or width of the light-emitting area, a size and/or width of the pixel PX may depend on the size and/or width of the corresponding opening 117OP of the pixel defining layer 117.

A capping layer 250 may be disposed on the opposite electrode 230. For example, as shown in the exemplary embodiment of FIG. 3, a lower surface of the capping layer 250 may directly contact an upper surface of the opposite electrode 230. In an exemplary embodiment, the capping layer 250 may include lithium fluoride (LiF). Alternatively, the capping layer 250 may include an inorganic insulating material such as silicon nitride, and/or an organic insulating material. However, exemplary embodiments of the present inventive concepts are not limited thereto. For example, in some exemplary embodiments, the capping layer 250 may be omitted.

A thin-film encapsulation layer 300 may be disposed on the capping layer 250. The organic light-emitting diode OLED may be covered by the thin-film encapsulation layer 300. As shown in the exemplary embodiment of FIG. 3, the thin-film encapsulation layer 300 may include first and second inorganic encapsulation layers 310 and 330 and an organic encapsulation layer 320 disposed therebetween (e.g., in the Z direction). However, exemplary embodiments of the present inventive concepts are not limited thereto and the number of the inorganic encapsulation layers and organic encapsulation layers and the arrangement thereto may vary in other exemplary embodiments.

Each of the first and second inorganic encapsulation layers 310 and 330 may include one or more inorganic insulating materials. For example, in an exemplary embodiment, the inorganic insulating materials may include at least one compound selected from aluminum oxide, titanium oxide, tantalum oxide, hafnium oxide, zinc oxide, silicon oxide, silicon nitride, and silicon oxynitride. In an exemplary embodiment, the first and second inorganic encapsulation layers 310 and 330 may be formed by using a chemical vapor deposition method. However, exemplary embodiments of the present inventive concepts are not limited thereto.

The organic encapsulation layer 320 may include a polymer-based material. Examples of the polymer-based material may include at least one compound selected from acrylic resin, an epoxy resin, polyimide, and polyethylene. For example, the organic encapsulation layer 320 may include an acrylic resin, for example, polymethyl methacrylate, polyacrylic acid, and the like. In an exemplary embodiment, the organic encapsulation layer 320 may be formed by curing a monomer or applying a polymer. However, exemplary embodiments of the present inventive concepts are not limited thereto.

In an exemplary embodiment, an optical functional layer such as a touch input layer, an antireflection layer, and a color filter layer, and an overcoat layer may be disposed on the thin-film encapsulation layer 300.

Figure 4:
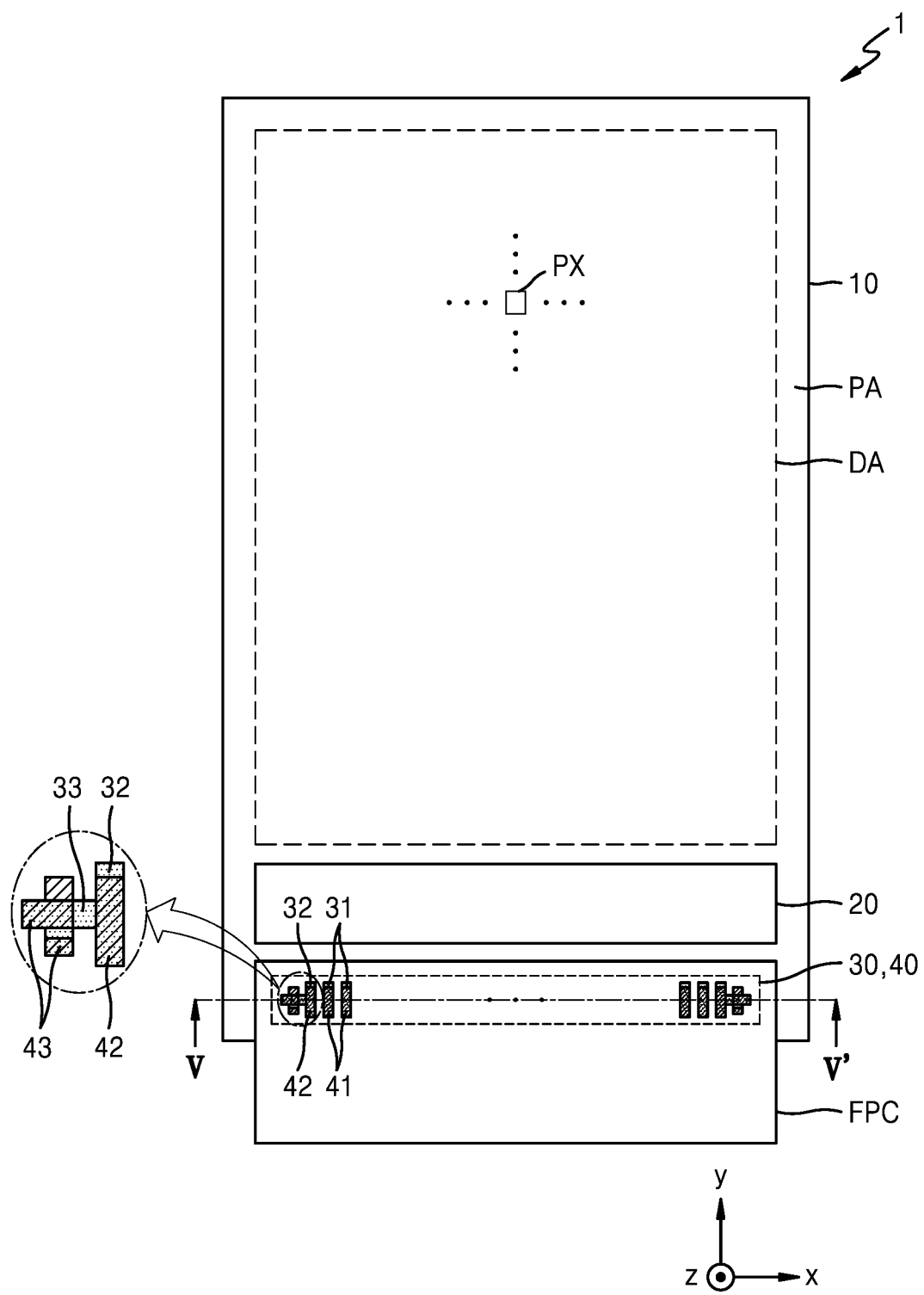
FIG. 4 is a plan view illustrating a display apparatus, according to an exemplary embodiment of the present inventive concepts.

FIG. 4 is a plan view schematically illustrating a display apparatus 1, according to an exemplary embodiment of the present inventive concepts. A description of the same elements and configuration as the elements and configuration described above with reference to FIG. 1 will be omitted, and differences will be mainly described below for convenience of explanation.

Referring to the exemplary embodiment of FIG. 4, the display apparatus 1 may include a PCB. As shown in the exemplary embodiment of FIG. 4, the PCB may be a flexible PCB FPC having flexible characteristics. In an exemplary embodiment, the flexible PCB FPC may be connected to an external system such as an application processor (AP) and/or a power supply unit to supply control signals and/or power to the driver integrated circuit 20 and the display panel 10. Hereinafter, for convenience of description, an exemplary embodiment in which the display apparatus 1 includes a flexible PCB FPC will be described. However, exemplary embodiments of the present inventive concepts are not limited thereto.

The flexible PCB FPC may be attached to a peripheral area PA of the display panel 10 and may be spaced apart from the driver integrated circuit 20 by a certain distance. For example, as shown in the exemplary embodiment of FIG. 4, the flexible PCB FPC may be disposed on a lower portion of the peripheral area PA (e.g., in the Y direction) and may be spaced apart from the driver integrated circuit 20 in the Y direction. However, exemplary embodiments of the present inventive concepts are not limited thereto. In an exemplary embodiment, the flexible PCB FPC and the display panel 10 may be attached to each other by using a conductive adhesive member. For example, the conductive adhesive member may be an anisotropic conductive film (ACF). However, exemplary embodiments of the present inventive concepts are not limited thereto.

The flexible PCB FPC may include a second pad portion 40 that corresponds to the first pad portion 30 of the display panel 10. For example, the second pad portion 40 may overlap the first pad portion 30 (e.g., in the Z direction) or be disposed adjacent to the first pad portion 30 when the flexible PCB FPC is attached to the peripheral area PA of the display panel 10. The second pad portion 40 may include a plurality of second signal pads 41, a second test pad 42, and a second alignment pad 43, and a plurality of second signal pads 41 of the second pad portion 40, the second test pad 42, and the second alignment pad 43 may correspond to the plurality of first signal pads 31, the first test pad 32, and the first alignment pad 33 of the first pad portion 30, respectively. For example, the plurality of second signal pads 41 of the second pad portion 40, the second test pad 42 and the second alignment pad 43 may overlap the plurality of first signal pads 31, the first test pad 32 and the first alignment pad 33 (e.g., in the Z direction) or be disposed adjacent thereto when the flexible PCB FPC is attached to the peripheral area PA of the display panel 10. Pads of the first pad portion 30 and the second pad portion 40 may include a conductive material.

The flexible PCB FPC may be attached to the display panel 10 such that the second pad portion 40 overlaps the first pad portion 30 (e.g., in the Z direction). The first alignment pad 33 and the second alignment pad 43 may align the flexible PCB FPC with respect to the display panel 10 so that the flexible PCB FPC attaches to the display panel 10 at the predetermined position. For example, in an exemplary embodiment, the first alignment pad 33 and the second alignment pad 43 may at least partially overlap each other (e.g., in the Z direction). The first alignment pad 33 has a first shape and the second alignment pad 43 has a second shape. When the first alignment pad 33 and the second alignment pad 43 a least partially overlap each other, the first shape of the first alignment pad 33 and the second shape of the second alignment pad 43 form an alignment mark having a specific shape, on a plane (e.g., in a plane defined in the X and Y directions). In an exemplary embodiment, the specific shape may be a shape including at least one or more bent portions or portions extending in at least two or more directions, such as a cross shape, an X shape, a Y shape, and a T shape. As shown in the exemplary embodiment of FIG. 4, the first alignment pad 33 and the second alignment pad 43 may form a cross-shaped alignment mafic. However, exemplary embodiments of the present inventive concepts are not limited thereto. The adhesion quality may be increased by aligning the display panel 10 with the flexible PCB FPC in the predetermined position such that the first alignment pad 33 and the second alignment pad 43 form a certain alignment mark on a plane, and then attaching the display panel 10 to the flexible PCB FPC. While the exemplary embodiment shown in FIG. 4 shows portions of the first alignment pad 33 overlapping the second alignment pad 43, in some exemplary embodiments, the first alignment pad 33 may be disposed adjacent to the second alignment pad to form the alignment mark and may not overlap the second alignment pad 43 when the display panel 10 is attached to the flexible PCB FPC in the predetermined position.

Figure 5:
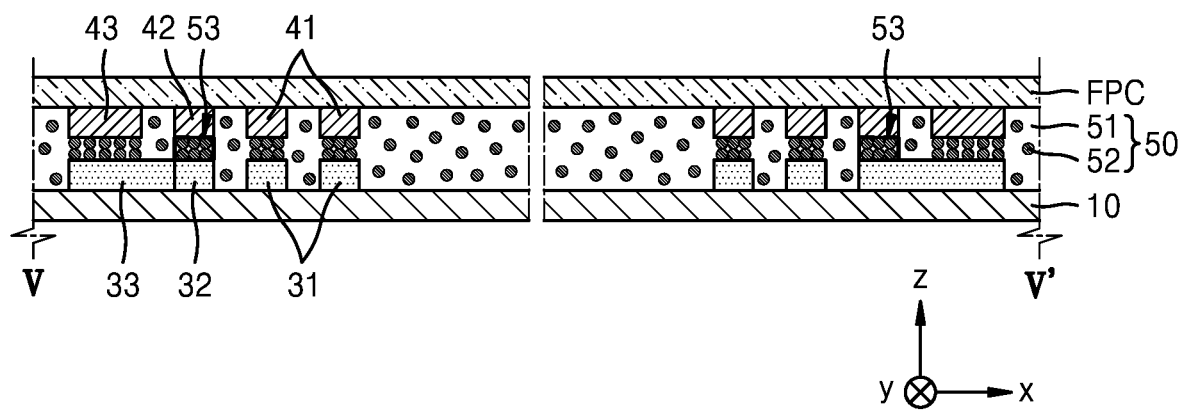
FIG. 5 is a cross-sectional view taken along V-V' of FIG. 4 illustrating a portion of the display apparatus according to an exemplary embodiment of the present inventive concepts.

FIG. 5 is a cross-sectional view schematically illustrating a portion of the display apparatus 1 of FIG. 4, according to an exemplary embodiment of the present inventive concepts.

FIG. 5 may correspond to a cross-section of the display apparatus 1, taken along line V-V' in FIG. 4, according to an exemplary embodiment of the present inventive concepts.

Referring to the exemplary embodiment of FIG. 5, the display panel 10 may be adhered to the flexible PCB FPC by using a conductive adhesive member 50, for example, an ACF. The conductive adhesive member 50 may include an adhesive resin 51 and a plurality of conductive balls 52 scattered in the adhesive resin 51. The display panel 10 may be aligned with the flexible PCB FPC such that the first pad portion 30 and the second pad portion 40 overlap each other (e.g., in the Z direction). In an exemplary embodiment, the conductive adhesive member 50 may be disposed between the first pad portion 30 and the second pad portion 40 (e.g., in the Z direction), and the display panel 10 may be attached to the flexible PCB FPC through a thermal compression process.

In an exemplary embodiment, each of the plurality of conductive balls 52 may be a conductive particle, and may include metals such as at least one metal selected from Ni, iron (Fe), Cu, Al, Sn, Zn, Cr, cobalt (Co), Ag, Au, and the like. The adhesive resin 51 may include an insulating polymer such as an epoxy resin or an acrylic resin.

The pads of the first pad portion 30 and the pads of the second pad portion 40 respectively corresponding to each other may be connected to each other by the conductive adhesive member 50. For example, the conductive balls 52 of the conductive adhesive member 50 may be disposed between the plurality of first signal pads 31 of the first pad portion 30 and the plurality of second signal pads 41 of the second pad portion 40. Accordingly, a first signal pad 31 and a second signal pad 41 corresponding to each other may be electrically connected to each other by using the conductive balls 52. Similarly, the first test pad 32 and the second test pad 42 may be electrically connected to each other via the conductive balls 52 disposed therebetween (e.g., in the Z direction). Similarly, the first alignment pad 33 and the second alignment pad 43 may be electrically connected to each other via the conductive balls 52 disposed therebetween (e.g., in the Z direction).

Hereinafter, as described below with reference to the exemplary embodiments of FIGS. 7A and 7B, a portion of the conductive adhesive member 50 disposed between the first test pad 32 and the second test pad 42 is a test bonding portion 53. The test bonding portion 53 may be a portion of an electrical path through which a test current for identifying whether the first pad portion 30 and the second pad portion 40 are properly connected flows.

Figure 6A:
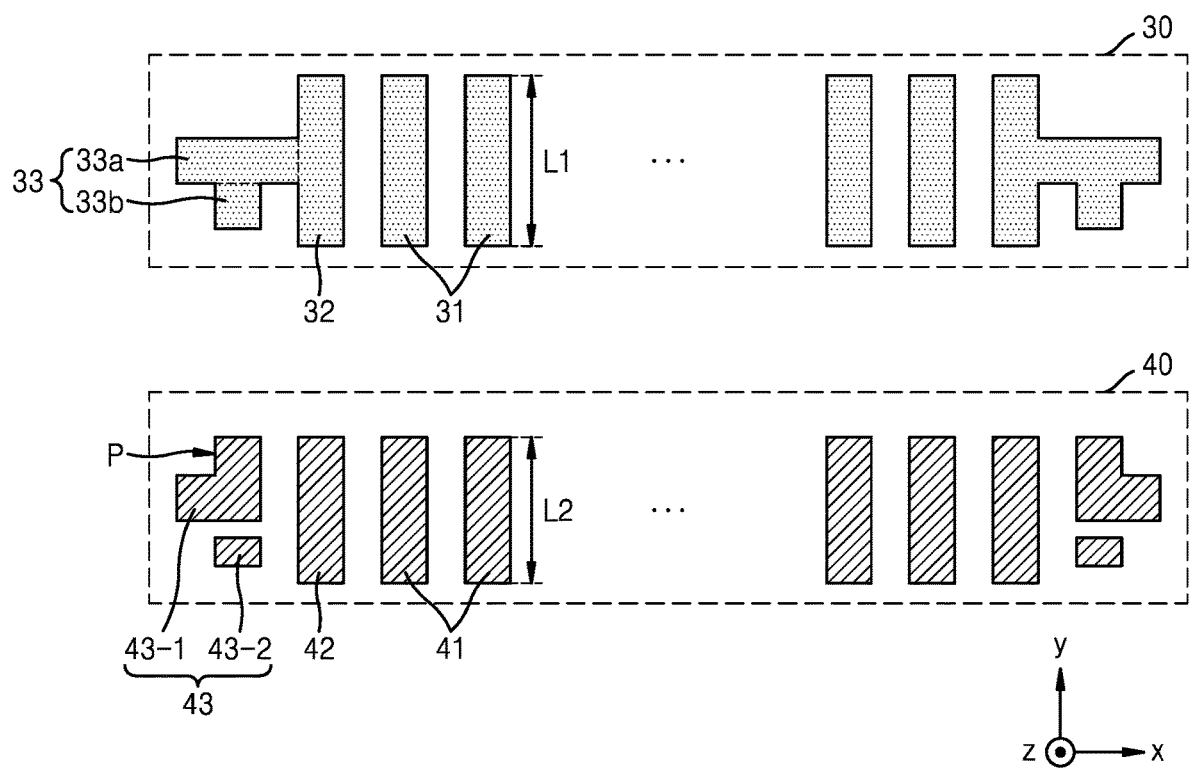
FIGS. 6A to 6C are plan views illustrating a first pad portion of a display panel and a second pad portion of a flexible printed circuit board, according to exemplary embodiments of the present inventive concepts.
Figure 6B:
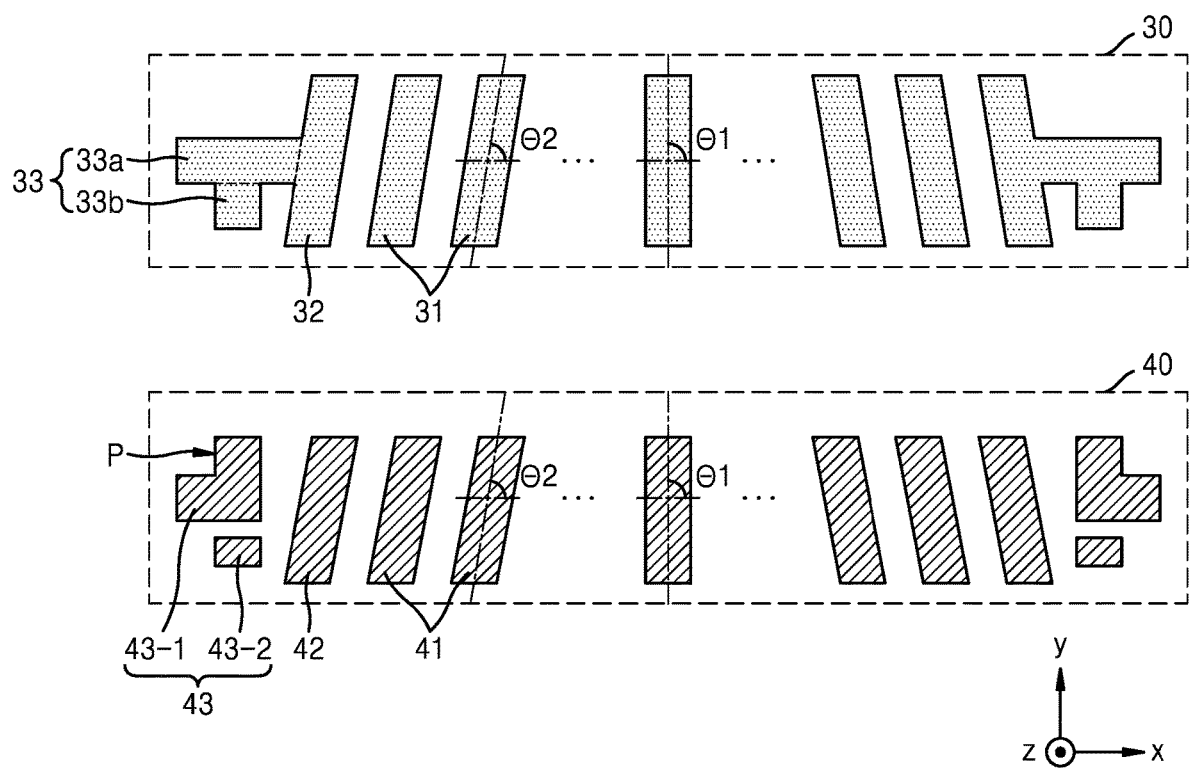
Figure 6C:
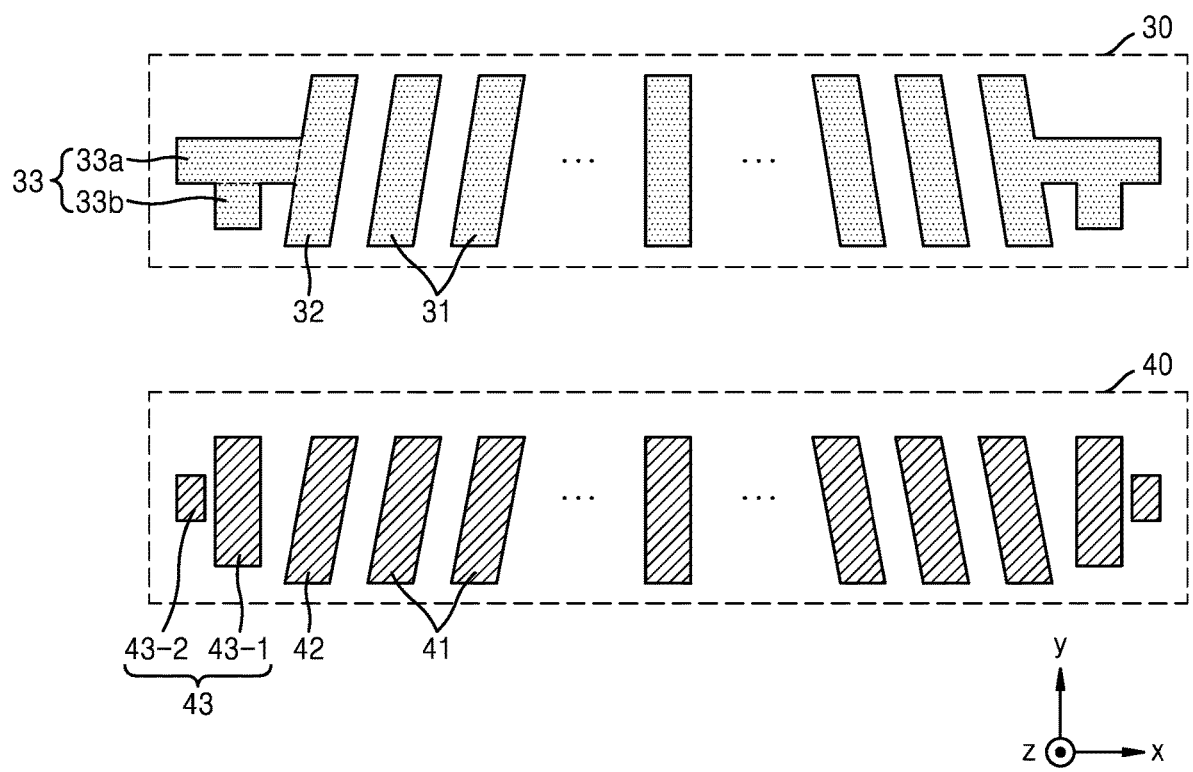

FIGS. 6A to 6C are plan views schematically illustrating a first pad portion of a display panel and a second pad portion of a flexible printed circuit board, according to exemplary embodiments of the present inventive concepts.

FIG. 6A is a side by side view of the first pad portion 30 of the display panel 10 and the second pad portion 40 of the flexible PCB FPC as viewed from the top of the display apparatus 1 in the Z direction. As described above, the first pad portion 30 and the second pad portion 40 may overlap each other (e.g., in the Z direction). The first pad portion 30 and the second pad portion 40 may be formed symmetrically left and right.

Referring to the exemplary embodiment of FIG. 6A, the first pad portion 30 may include a plurality of first signal pads 31, a first test pad 32, and a first alignment pad 33. While the exemplary embodiment of FIG. 6A shows one first test pad 32 and one first alignment pad 33, in another exemplary embodiment there may be two or more first test pads 32 and/or first alignment pads 33.

The plurality of first signal pads 31, the first test pad 32, and the first alignment pad 33 may be arranged in a first direction (e.g., X direction). The plurality of first signal pads 31 and the first test pad 32 may extend longitudinally in a second direction (e.g., Y direction) that intersects with the first direction. As shown in the exemplary embodiment of FIG. 6A, the lengths of the first signal pad 31 and the first test pad 32 (e.g., in the Y direction) may be substantially the same. However, exemplary embodiments of the present inventive concepts are not limited thereto.

In an exemplary embodiment, the first alignment pad 33 may be disposed at the outermost lateral edge of the first pad portion 30 (e.g., in the X direction), and the first test pad 32 may be disposed adjacent to the first alignment pad 33 (e.g., in the X direction). The plurality of first signal pads 31 may be disposed in the central portion of the first pad portion 30 area (e.g., in the X direction). The first test pad 32 may be disposed between the first alignment pad 33 and the plurality of first signal pads 31 (e.g., in the X direction). However, exemplary embodiments of the present inventive concepts are not limited thereto and the arrangement of the first alignment pad 33, the plurality of first signal pads 31 and the first test pad 32 may vary. For example, in another exemplary embodiment, the first alignment pad 33 and the first test pad 32 may be disposed in the central portion of the first pad portion 30 area.

In an exemplary embodiment, the first alignment pad 33 may include at least one bent portion or portions extending in at least two or more directions. As shown in the exemplary embodiment of FIG. 6A, the first alignment pad 33 may include a body portion 33a extending longitudinally in a first direction (e.g., the X direction) from the first test pad 32, and a branch portion 33b extending in a second direction (e.g., the Y direction) intersecting with the first direction from the body portion 33a. As a comparative example, when the first alignment pad includes only a portion extending in one direction, only the alignment in that direction may be checked. However, according to an exemplary embodiment, since the first alignment pad 33 includes a portion extending in at least two directions, alignment of those two directions may be confirmed on a plane (e.g., in a plane defined in the X and Y directions).

The first alignment pad 33 may be electrically connected to the first test pad 32. For example, as shown in the exemplary embodiment of FIG. 6A, the first test pad 32 and the first alignment pad 33 are arranged adjacent to each other, and the first test pad 32, the body portion 33a of the first alignment pad 33, and the branch portion 33b of the first alignment pad 33 may be integrally formed.

The second pad portion 40 may include a plurality of second signal pads 41, a second test pad 42, and a second alignment pad 43. As shown in the exemplary embodiment of FIG. 6A, the second pad portion 40 may include one second test pad 42 and one second alignment pad 43. However, exemplary embodiments of the present of the inventive concepts are not limited thereto and there may be two or more second test pads 42 and/or two or more second alignment pads 43 in other exemplary embodiments.

Similar to the first pad portion 30, the plurality of second signal pads 41, the second test pad 42, and the second alignment pad 43 of the second pad portion 40 may be arranged in a first direction (e.g., the X direction). The plurality of second signal pads 41 and the second test pad 42 may extend longitudinally in a second direction (e.g., the Y direction) intersecting with the first direction. The lengths of each of the plurality of second signal pads 41 and the second test pad 42 in the second direction (e.g., the Y direction) may be substantially the same. The plurality of second signal pads 41 may overlap the plurality of first signal pads 31. The plurality of second signal pads 41 may have an arrangement and shape that generally correspond to those of the plurality of first signal pads 31. The second test pad 42 may overlap the first test pad 32. The second test pad 42 may have a shape and arrangement that generally corresponds to those of the first test pad 32.

As shown in the exemplary embodiment of FIG. 6A, the second length L2 (e.g., length in the Y direction) of the plurality of second signal pads 41 of the second pad portion 40 may be less than a first length L1 (e.g., length in the Y direction) of the plurality of first signal pads 31 of the first pad portion 30. When a conductive contact member is disposed on the first pad portion 30 and then, the second pad portion 40 is attached thereon, since the second length L2 is less than the first length L1, it may be easier to attach the entire area of the second pad portion 40 thereon.

In an exemplary embodiment, the second alignment pad 43 may be disposed at the outermost lateral edge of the second pad portion 40 area, and the second test pad 42 may be arranged adjacent to the second alignment pad 43 (e.g., in the X direction). The plurality of second signal pads 41 may be arranged in the central portion of the second pad portion 40 area. The second test pad 42 may be disposed between the second alignment pad 43 and the plurality of second signal pads 41 (e.g., in the X direction). However, exemplary embodiments of the present inventive concepts are not limited to this arrangement, and as another example, the second alignment pad 43 and the second test pad 42 may be arranged in the central portion of the second pad portion 40 area.

The second alignment pad 43 may be spaced apart from the second test pad 42 (e.g., in the X direction). The second alignment pad 43 may include a first portion 43-1 and a second portion 43-2 that are spaced apart from each other (e.g., in the Y direction). In an exemplary embodiment, the first portion 43-1 includes a portion extending longitudinally in a first direction (e.g., the X direction), and the second portion 43-2 may be spaced apart from the first portion 43-1 in a second direction (e.g., the Y direction) intersecting with the first direction. For example, the second test pad 42, the first portion 43-1 of the second alignment pad 43, and the second portion 43-2 of the second alignment pad 43 are spaced apart from each other, and may each have an isolated shape on a plane (e.g., in a plane defined in the X and Y directions) in which the second test pad 42, the first portion 43-1 of the second alignment pad 43, and the second portion 43-2 of the second alignment pad 43 do not contact each other. Based on this arrangement, as will be described later below, the second test pad 42, the first portion 43-1 of the second alignment pad 43, and the second portion 43-2 may function as different electrodes in the adhesion defect test.

In an exemplary embodiment, when the first pad portion 30 and the second pad portion 40 overlap at the predetermined position, each of the first portion 43-1 and the second portion 43-2 of the second alignment pad 43 may overlap a portion of the first alignment pad 33. A portion of the first alignment pad 33 may overlap the space between the second test pad 42 and the first portion 43-1 of the second alignment pad 43 and the space between the first portion 43-1 and the second portion 43-2 of the second alignment pad 43.

In addition, the first portion 43-1 of the second alignment pad 43 may include a protruding portion P that extends longitudinally in an opposite direction as the branch portion 33*b* of the first alignment pad 33 relative to the body portion 33*a* of the first alignment pad 33. For example, as shown in the exemplary embodiment of FIG. 6A, when the first alignment pad 33 includes the branch portion 33*b* protruding from the body portion 33*a* downwardly in the Y direction, the first portion 43-1 of the second alignment pad 43 includes a protruding portion P protruding upwardly in the Y direction. When the first alignment pad 33 and the second alignment pad 43 overlap at the correct position, the protruding portion P of the first portion 43-1 of the second alignment pad 43 may not overlap the first alignment pad 33 (e.g., in the Z direction).

Through the shape and arrangement of the first alignment pad 33 and the second alignment pad 43, when the first pad portion 30 and the second pad portion 40 overlap at the predetermined position, the first alignment pad 33 and the second alignment pad 43 may form an alignment mark of a specific shape which indicates that the flexible PCB FPC is attached to the display panel 10 in the predetermined position that provides increased adhesion. For example, the alignment mark may be a cross-shaped alignment mark (e.g., in a plane defined in the X and Y directions). The inspection of the alignment mark permits the user to confirm that the alignment between the first pad portion 30 and the second pad portion 40 (e.g., in the X and Y directions) is correct and the flexible PCB FPC is attached to the display panel 10 in the predetermined position. Referring to the exemplary embodiment of FIG. 6B, a plurality of first signal pads 31 are arranged in a first direction (e.g., the X direction). However, the plurality of first signal pads 31 may extend longitudinally in different directions from each other. As shown in the exemplary embodiment of FIG. 6B, the first signal pads 31 disposed in the central portion of the first pad portion 30 (e.g., in the X direction) from among the plurality of first signal pads 31 may extend in a second direction (e.g., the Y direction) intersecting with the first direction. In contrast, the first signal pads 31 disposed at opposite lateral edges of the first pad portion 30 may extend in a third direction that is different from the first direction and the second direction. For example, the third direction may lie on the same plane as the first direction and the second direction, but may intersect with both the first and second directions. For example, the third direction may extend on the same plane as the X and Y directions and may be disposed between the X and Y directions.

An angle formed by the arrangement direction of the plurality of first signal pads 31 (e.g., the X direction) and the longitudinal extension direction of each of the plurality of first signal pads 31 in the central portion of the first pad portion 30 may be a first angle θ1. In an exemplary embodiment, the first angle θ1 may be about 90 degrees. On the other hand, an angle formed by the arrangement direction and longitudinal extension direction of the first signal pads 31 arranged at opposite lateral edges of the first pad portion 30 may be a second angle θ2, which may be less than about 90 degrees.

In another exemplary embodiment, the plurality of first signal pads 31 may be formed such that an angle formed by an arrangement direction and longitudinal extension direction of the first signal pads 31 decreases from the central portion of the first pad portion 30 toward both lateral edges.

As described above, an angle formed by the arrangement direction and longitudinal extension direction of the plurality of first signal pads 31 may vary according to the positions of each of the plurality of first signal pads 31 on the first pad portion 30 (e.g., in the X direction), and the plurality of second signal pads 41 may be formed to respectively correspond to the plurality of first signal pads 31. Therefore, it may be easier to determine whether the alignment of the first pad portion 30 and the second pad portion 40 is the predetermined alignment in which the flexible PCB FPC is attached to the display panel 10 in the predetermined position. For example, the plurality of first signal pads 31 and the plurality of second signal pads 41 all extend in the same direction, but at least some of them extend in different directions, and thus, misalignment may be more easily identified.

Referring to the exemplary embodiment of FIG. 6C, the plurality of second signal pads 41 of the second pad portion 40 may be arranged in a first direction (e.g., the X direction), and the second alignment pad 43 may include the first portion 43-1 and the second portion 43-2. The first portion 43-1 may extend longitudinally in a second direction (e.g., the Y direction) intersecting with the first direction, and the second portion 43-2 may be spaced apart from the first portion 43-1 in the first direction (e.g., the X direction). The first portion 43-1 of the second alignment pad 43 extends longitudinally in the second direction (e.g., the Y direction), and when the first pad portion 30 and the second pad portion 40 overlap each other when the flexible PCB FCP is attached to the display panel 10 at the predetermined position, a portion of the first portion 43-1 that does not overlap with the first alignment pad 33 (e.g., in the Z direction) may be formed.

In addition, the first portion 43-1 and the second portion 43-2 of the second alignment pad 43 may overlap a portion of the first alignment pad 33, and a portion of the first alignment pad 33 may overlap a space between the first portion 43-1 and the second portion 43-2 and a space between the first portion 43-1 and the second test pad 42.

Through such a shape and arrangement, when the second alignment pad 43 overlaps the first alignment pad 33 at the predetermined position, an alignment mark having, for example, a cross shape may be formed on a plane (e.g., in a plane defined in the X and Y directions), and may be used to align the first pad portion 30 with the second pad portion 40. In addition, the second alignment pad 43 includes the second portion 43-2 spaced apart therefrom in a second direction intersecting with the longitudinal extension direction of the first portion 43-1, and thus, an alignment in at least two directions may be confirmed on a plane.

In addition, the first portion 43-1 and the second portion 43-2 are formed to be spaced apart from each other (e.g., in the X direction), and may thus function as different electrodes during an adhesion defect test as described later below.

Figure 7A:
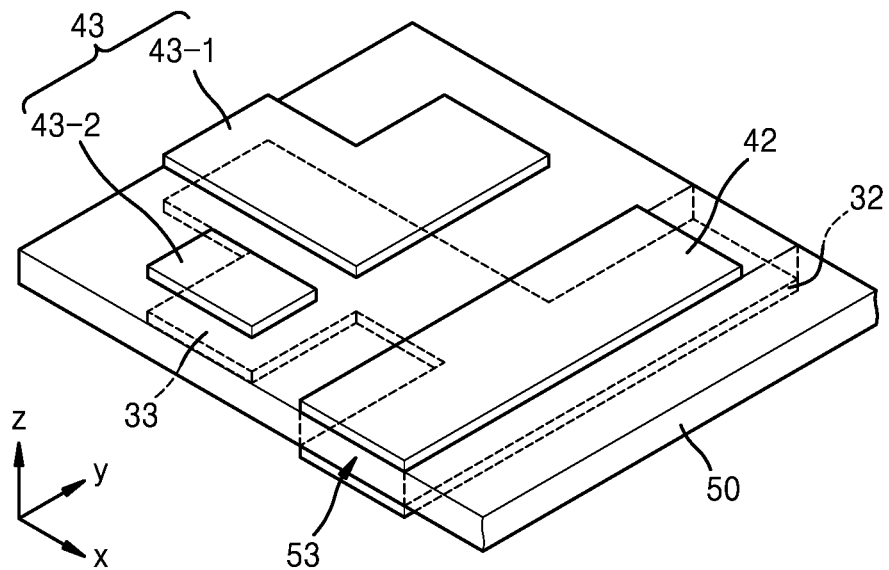
FIG. 7A is a perspective view illustrating a portion of a first pad portion of a display panel and a second pad portion of a flexible printed circuit board, according to an exemplary embodiment of the present inventive concepts.
Figure 7B:
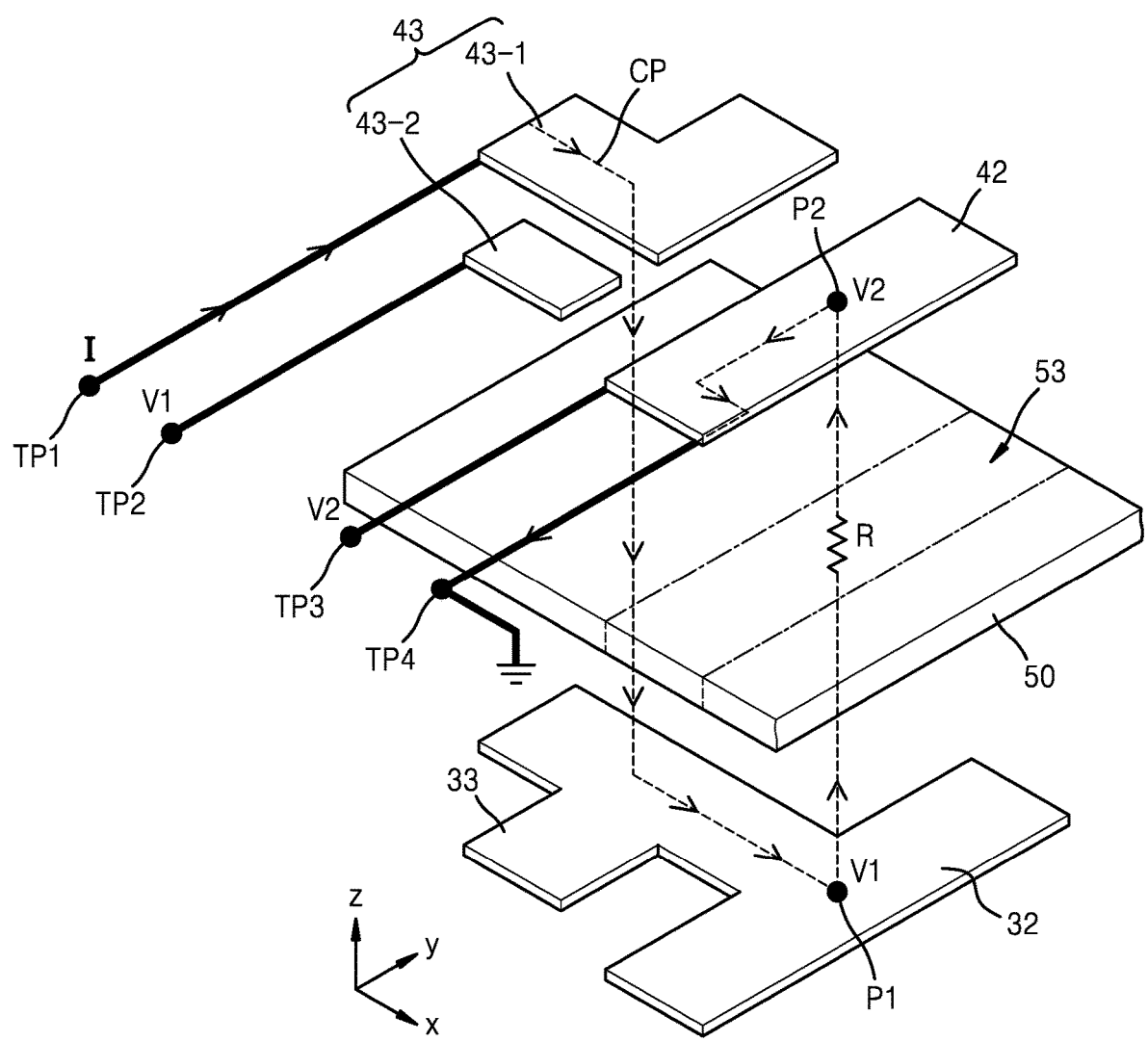
FIG. 7B is an exploded perspective view schematically illustrating a portion of the first pad portion and the second pad portion of FIG. 7A according to an exemplary embodiment of the present inventive concepts.

FIG. 7A is a perspective view schematically illustrating a first pad portion of a display panel and a portion of a second pad portion of a flexible printed circuit board according to an exemplary embodiment of the present inventive concepts, and FIG. 7B is an exploded perspective view schematically illustrating a portion of the first pad portion and the second pad portion of FIG. 7A.

FIG. 7A shows a state in which the first pad portion 30 and the second pad portion 40 are aligned with each other at the predetermined position, and a flexible PCB FPC (in FIG. 4) is attached to the display panel 10 (in FIG. 4) by using a conductive adhesive member 50, by aligning the first test pad 32 and the first alignment pad 33 of the first pad portion 30, and the second test pad 42 and the second alignment pad 43 of the second pad portion 40 to form the predetermined alignment mark. FIG. 7B is an exploded view of the configuration shown in FIG. 7A.

Referring to the exemplary embodiments of FIGS. 7A and 7B, a portion of the conductive adhesive member 50 may be disposed between the first test pad 32 and the second test pad 42 (e.g., in the Z direction), and may attach the first test pad 32 to the second test pad 42. Hereinafter, for convenience of description, this portion of the conductive adhesive member 50 will be referred to as the test bonding portion 53.

According to exemplary embodiments of the present inventive concepts, the resistance of the test bonding portion 53 may be measured to determine whether the display panel 10 and the flexible PCB FPC are properly attached to each other. For example, if the measured resistance of the test bonding portion 53 is greater than a normal value, this may indicate adhesion failure, and if the measured resistance of the test bonding portion 53 is less than the normal value this may indicate good adhesion. Hereinafter, a method of measuring the resistance of the test bonding portion 53 will be described.

Each of the second test pad 42 and the second alignment pad 43 may include at least one test terminal. For example, as shown in the exemplary embodiment of FIG. 7B, the first portion 43-1 and the second portion 43-2 of the second alignment pad 43 may include a first test terminal TP1 and a second test terminal TP2, respectively. The second test pad 42 may include at least two or more test terminals, for example, a third test terminal TP3 and a fourth test terminal TP4.

In an exemplary embodiment, a test current I may be applied to one of the first test terminal TP1 and the fourth test terminal TP4, and the other one of the first test terminal TP1 and the fourth test terminal TP4 may be grounded. For convenience of explanation, an embodiment in which the test current I is applied to the first test terminal TP1 and the fourth test terminal TP4 is grounded will be described. However, exemplary embodiments of the present inventive concepts are not limited thereto. A path through which the test current I flows may be formed between the first test terminal TP1 and the fourth test terminal TP4. As an example, the test current I may flow from the first test terminal TP1 to the first portion 43-1 of the second alignment pad 43, the first alignment pad 33, the first test pad 32, the test bonding portion 53, the second test pad 42, and reach the fourth test terminal TP4. Since the conductive adhesive member 50 is disposed between the first alignment pad 33 and the second alignment pad 43, and between the first test pad 32 and the second test pad 42, the test current I may flow through the conductive balls 52 of the conductive adhesive member 50.

In this state, a first voltage V1 at the second test terminal TP2 and a second voltage V2 at the third test terminal TP3 may be measured. The second portion 43-2 of the second alignment pad 43 and the first test pad 32 are electrically connected to each other through the conductive adhesive member 50 and the first alignment pad 33, but no current flows, so there is no voltage drop. Therefore, a voltage at a first position P1 of the first test pad 32 may be the same as the first voltage V1. A voltage at a second position P2 of the second test pad 42 may be the same as the second voltage V2.

As a result, the first and second voltages V1 and V2 at opposite sides of the test bonding portion 53, that is, the first position P1 and the second position P2, may be measured, and the test current I flowing through the test bonding portion 53 may be identified. Accordingly, a resistance R of the test bonding portion 53 may be measured by using the following equation.

$$R = \frac{(V1 - V)}{I} \qquad \text{Equation (1)}$$

By using the resistance R of the test bonding portion 53 measured in this way, it is possible to determine whether there is an adhesion defect between the display panel 10 and the flexible PCB FPC.

In another exemplary embodiment, when the test current I is applied to the first test terminal TP1 and the fourth test terminal TP4 is grounded, voltages at each of the first test terminal TP1 and the fourth test terminal TP4 may be measured. Through this, a total resistance in the path of the test current I between the first test terminal TP1 and the fourth test terminal TP4 may be obtained, and because the total resistance includes the resistance R of the test bonding portion 53, adhesion defects may be checked by using the total resistance.

According to the exemplary embodiments, an adhesion defect test may be performed to check whether the first pad portion 30 of the display panel 10 and the second pad portion 40 of the flexible PCB FPC are properly connected to each other. According to exemplary embodiments of the present inventive concepts, since an alignment pad is used for the adhesion defect test, the adhesion defect test may be performed by using only one of the pads of each of the first pad portion 30 and the second pad portion 40. Through this, it is possible to significantly reduce the number of test pads that cannot be used as signal pads, and to increase the number of signal pads available in a limited pad portion area. Alternatively, the dead space of display apparatus 1 may be significantly reduced by reducing the area of the pad portion.

While the display apparatus has been mainly described, exemplary embodiments of the present inventive concepts are not limited thereto. For example, a method of manufacturing a display apparatus also falls within the scope of the present inventive concepts.

According to an exemplary embodiment of the present inventive concepts, a display apparatus may provide a relatively easy detection concerning whether the PCB is attached to the display panel at an accurate position, and the PCB and the display panel are properly connected to each other. The display apparatus may increase the ability for the user to correctly align the circuit board with the display panel. In addition, a display apparatus in which the pad portion area of the display panel may be reduced may be implemented. However, the scope of the present inventive concepts are not limited by these effects.

It should be understood that exemplary embodiments of the present inventive concepts described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a display panel comprising a first pad portion;
a flexible printed circuit board that is configured to attach to the display panel, the flexible printed circuit board comprising a second pad portion that is configured to electrically connect to the first pad portion;
the first pad portion comprises a plurality of first signal pads, a first test pad, and a first alignment pad having a first shape; and
the second pad portion comprises a second alignment pad having a second shape, the second alignment pad including a first portion and a second portion that are spaced apart from each other,
wherein the first shape and the second shape are configured to form a predetermined alignment mark when the flexible printed circuit board is attached to the display panel at a predetermined position.

2. The display apparatus of claim 1, wherein each of the first portion and the second portion of the second alignment pad overlaps a portion of the first alignment pad when the flexible printed circuit board is attached to the display panel at the predetermined position.

3. The display apparatus of claim 1, wherein the second pad portion further comprises:
a plurality of second signal pads that respectively overlap the plurality of first signal pads; and
a second test pad that is spaced apart from the second alignment pad, and overlaps the first test pad.

4. The display apparatus of claim 3, wherein the second test pad is disposed between the second alignment pad and the plurality of second signal pads.

5. The display apparatus of claim 3, wherein the second test pad and the first portion and the second portion of the second alignment pad do not contact each other and have shapes that are isolated from each other.

6. The display apparatus of claim 3, wherein:
the second test pad, and the first portion and the second portion of the second alignment pad are spaced apart from each other; and
a portion of the first alignment pad is positioned to overlap a first space between the second test pad and the first portion of the second alignment pad, and a second space between the first and second portions of the second alignment pad when the flexible printed circuit board is attached to the display panel at the predetermined position.

7. The display apparatus of claim 3, wherein each of the second test pad and the second alignment pad comprises a test terminal.

8. The display apparatus of claim 7, wherein:
the second test pad comprises two or more test terminals; and
each of the first portion and the second portion of the second alignment pad comprises a separate test terminal.

9. The display apparatus of claim 7, wherein:
a first test terminal of the test terminals of the second test pad and the second alignment pad is configured to receive a current and a second test terminal of the test terminals of the second test pad and the second alignment pad is grounded; and
the first alignment pad and the second alignment pad are configured to form an electrical path through which the current flows.

10. The display apparatus of claim 1, wherein the first alignment pad is configured to be electrically connected to the first test pad.

11. The display apparatus of claim 1, wherein the first alignment pad comprises:
a body portion extending longitudinally in a first direction from the first test pad, and
a branch portion protruding from the body portion in a second direction that intersects with the first direction.

12. The display apparatus of claim 11, wherein the first test pad and the body portion and the branch portion of the first alignment pad are integrally formed.

13. The display apparatus of claim 11, wherein the first portion of the second alignment pad comprises a protruding portion that is positioned to overlap an opposite side of the branch portion relative to the body portion of the first alignment pad when the flexible printed circuit board is attached to the display panel at the predetermined position.

14. The display apparatus of claim 3, wherein:
the plurality of first signal pads and the plurality of second signal pads are arranged in a first direction;
the first portion of the second alignment pad includes a portion extending longitudinally in the first direction; and
the second portion of the second alignment pad is spaced apart from the first portion in a second direction intersecting with the first direction.

15. The display apparatus of claim 3, wherein:
the plurality of first signal pads and the plurality of second signal pads are arranged in a first direction;
the first portion of the second alignment pad comprises a portion extending longitudinally in a second direction intersecting with the first direction; and
the second portion of the second alignment pad is spaced apart from the first portion in the first direction.

16. The display apparatus of claim 3, wherein:
the plurality of first signal pads and the plurality of second signal pads are arranged in a first direction,
a first first signal pad of the plurality of first signal pads and a first second signal pad of the plurality of second signal pads extend in a second direction intersecting with the first direction, and
a second first signal pad of the plurality of first signal pads and a second second signal pad of the plurality of second signal pads extend in a third direction that is different from the first direction and the second direction.

17. The display apparatus of claim 13, wherein a length of the plurality of first signal pads is greater than a length of the plurality of second signal pads.

18. The display apparatus of claim 1, further comprising a conductive adhesive member disposed between the first pad portion and the second pad portion.

19. The display apparatus of claim 1, further comprising:
a plurality of pixel circuits each comprising thin-film transistors and at least one storage capacitor,
wherein the plurality of first signal pads are configured to be electrically connected to the plurality of pixel circuits, respectively, and
the first test pad is configured to be electrically open with the plurality of pixel circuits.

* * * * *